(12) United States Patent
Wessling

(10) Patent No.: US 7,396,596 B2
(45) Date of Patent: Jul. 8, 2008

(54) ARTICLE WITH A COATING OF ELECTRICALLY CONDUCTIVE POLYMER

(75) Inventor: Bernhard Wessling, Bargteheide (DE)

(73) Assignee: Ormecon GmbH, Ammersbek (DE)

( * ) Notice: Subject to any disclaimer, the term of this patent is extended or adjusted under 35 U.S.C. 154(b) by 0 days.

(21) Appl. No.: 11/165,411

(22) Filed: Jun. 23, 2005

(65) Prior Publication Data

US 2006/0019090 A1  Jan. 26, 2006

(30) Foreign Application Priority Data

Jun. 23, 2004  (DE) .................. 10 2004 030 388

(51) Int. Cl.
*B32B 15/04* (2006.01)
*B32B 15/08* (2006.01)
*B32B 15/20* (2006.01)
*H05K 1/00* (2006.01)
*H05K 1/02* (2006.01)

(52) U.S. Cl. .................. 428/674; 428/332; 428/336; 428/671; 428/457; 174/250

(58) Field of Classification Search .................. 428/674, 428/332, 671, 336, 457, 458; 174/250, 256
See application file for complete search history.

(56) References Cited

U.S. PATENT DOCUMENTS

| 4,657,632 | A | 4/1987 | Holtzman et al. |
| 5,192,835 | A | 3/1993 | Bull et al. |
| 5,532,025 | A | 7/1996 | Kinlen |
| 5,645,890 | A | 7/1997 | MacDiarmid |
| 5,846,606 | A | 12/1998 | Wessling et al. |
| 5,922,466 | A | 7/1999 | Angelopoulos |
| 6,015,482 | A | 1/2000 | Stern et al. |
| 6,015,613 | A * | 1/2000 | Kinlen et al. .............. 428/332 |
| 6,123,995 | A * | 9/2000 | Sonnenberg et al. ........ 427/336 |
| 6,194,087 | B1 | 2/2001 | Huhn et al. |
| 6,361,823 | B1 | 3/2002 | Bokisa |
| 6,592,020 | B1 | 7/2003 | Currie et al. |
| 6,784,530 | B2 | 8/2004 | Sugaya et al. |
| 7,018,866 | B2 | 3/2006 | Sugaya et al. |
| 7,087,441 | B2 | 8/2006 | Konrad et al. |

(Continued)

FOREIGN PATENT DOCUMENTS

CA  2000431  *  1/2000

(Continued)

OTHER PUBLICATIONS

EPA "Alternative Technologies for Surface Finishing—Cleaner Technology for Printing Wired Board Manufacturers," Office of Pollution Prevention and Toxics, Jun. 2001, EPA 744-R-01-001.

(Continued)

*Primary Examiner*—Michael La Villa
(74) *Attorney, Agent, or Firm*—Swanson & Bratschun, LLC

(57) ABSTRACT

A coated article, which has (i) at least one electrically non-conductive base layer, (ii) at least one layer of copper and/or a copper alloy, and (iii) a layer which contains at least one electrically conductive polymer. The article is characterized in that the copper or copper alloy layer (ii) is positioned between the base layer (i) and the layer (iii) containing the conductive polymer.

14 Claims, 1 Drawing Sheet

U.S. PATENT DOCUMENTS

| | | |
|---|---|---|
| 2002/0187364 A1 | 12/2002 | Heber |
| 2003/0075270 A1* | 4/2003 | Landi et al. ................. 156/334 |
| 2004/0026363 A1* | 2/2004 | Akamatsu et al. ............. 216/13 |
| 2004/0060729 A1 | 4/2004 | Knadle |
| 2004/0086697 A1 | 5/2004 | Egli et al. |

FOREIGN PATENT DOCUMENTS

| | | |
|---|---|---|
| DE | 42 38 765 | 5/1994 |
| EP | 0 407 492 B1 | 7/1997 |
| EP | 0 807 190 B1 | 10/1997 |
| EP | 0 656 958 B1 | 4/1999 |
| EP | 0 700 573 B1 | 2/2002 |
| EP | 1 477 587 | 11/2004 |
| GB | 2 126 250 | 3/1984 |
| JP | 2003 129 278 | 10/2001 |
| JP | 2003 332 391 | 5/2002 |
| JP | 2002-289653 | 10/2002 |
| WO | WO 95/00678 | 1/1995 |
| WO | WO 95/09255 | 4/1995 |
| WO | WO 99/05687 | 2/1999 |
| WO | WO 2004/016698 | 2/2004 |

OTHER PUBLICATIONS

Brusic et al. (1997) J. Electrochem. Soc. 144(2):436-442, Feb.
Parquet and Boggs (1995) Electronic Packaging & Productions 9(August):38-42.
Posdorfer and Wessling (2000) Ormecon GmbH, Ammersbek "Oxidation of copper in the presence of Organic metal polyaniline", July.
Wessling et al. (2000) Eur. Phys. J. E 2:207-210, no month.
Ormecon CSN process, Ormecon GmbH, Ammersbek, no date.
Ormecon CSN FF process, Ormecon GmbH, Ammersbek, no date.

* cited by examiner

ARTICLE WITH A COATING OF ELECTRICALLY CONDUCTIVE POLYMER

RELATED APPLICATION DATA

This application claims benefit of commonly assigned and copending German Patent Application Serial Number 10 2004 030 388.6, filed Jun. 23, 2004, entitled ARTICLE WITH A COATING OF ELECTRICALLY CONDUCTIVE POLYMER AND PROCESS FOR PRODUCTION THEREOF, which application is incorporated herein in its entirety by reference.

TECHNICAL FIELD

The present invention concerns coated articles which contain a layer of copper or a copper alloy and a layer of an electrically conductive polymer and which are particularly suitable as printed circuit boards or for the production of printed circuit boards.

BACKGROUND ART

Copper is one of the most widely used metallic materials of our time. Although copper is a semiprecious metal, this material is readily oxidizable, which often has an adverse effect on its use properties. This manifests itself not only visually but also has in particular practical technical disadvantages. Particular problems arise in the coating of printed circuit boards, which are then assembled in soldering processes, copper wires which are used as electrical conductors, or copper pipes. Finely divided copper powders are practically impossible to produce and use without oxidation protection.

Copper is normally not provided with protective coatings like iron and steel, which in the case of lacquers often have to be applied in several layers. Instead, as protection against copper corrosion, substances which form complexes with copper, such as for example imidazoles, benzimidazoles, benzotriazoles, thiourea and imidazole-2-thione, are predominantly used.

Such organic complexing agents are admittedly inexpensive and easy to process, however they display a number of disadvantages. Thus formulations with imidazoles or benzimidazoles often contain formic acid and sometimes other organic acids which smell unpleasant, are corrosive and have toxicological disadvantages. In addition, the thermal stability is low.

Therefore, in the production of printed circuit boards, for protection against corrosion copper is often coated with other metals such as for example gold, silver or tin, in order to preserve the solderability of the copper contacts and the copper-plated drill holes, which is lost in a very short time through oxidation.

An overview of common solderable final surfaces and their technical, economic, ecological and toxicological advantages and disadvantages are disclosed in "Alternative Technologies for Surface Finishing—Cleaner Technology for Printed Wired Board Manufacturers", EPA, Office of Pollution Prevention and Toxics, June 2001, EPA 744-R-01-001.

Metallic coatings are in general very suitable for printed circuit boards, however they also display a number of disadvantages. Coatings with gold are expensive not only on account of the high gold price, but in addition require special processes for the application of the gold layer. For example, gold cannot chemically be applied in so-called horizontal plants but only in vertical plants, which results in additional high process costs.

The application of silver is poorly reproducible, and the necessary plants are difficult to regulate.

Tin is admittedly satisfactory from the technical and economic point of view in particular when it is applied with the aid of an organic metal, such as for example in the ORMECON CSN-process of Ormecon GmbH, however its deposition as a rule requires several minutes, which renders correspondingly large-sized plants necessary in order to ensure a high throughput.

From EP 0 807 190 B1, a process for the production of metallized materials is known, wherein the material to be metallized is first coated with an intrinsically conductive polymer, the intrinsically conductive polymer is then activated by reduction and finally the metal is applied in a non-electrochemical manner, in that the coated material is brought into contact with a solution of ions of the metal. The process is particularly suitable for the deposition of tin onto copper but also for the metallization of plastic surfaces.

EP 0 407 492 B1 discloses a process for the coating of substrates with thin layers of intrinsically conductive polymers, wherein for example polyaniline is non-electro-chemically deposited from a metastable dispersion onto a substrate. As substrates, inter alia metals such as gold, platinum, iron, copper and aluminium are mentioned. With metals that are less noble than silver, the layers of conductive polymer lead to the formation of metal oxide layers and should be suitable inter alia for corrosion protection.

EP 0 656 958 B1 concerns a process for the production of corrosion-protected metallic materials such as iron, steel, copper and aluminium, wherein a layer of an intrinsically conductive polymer is applied onto a metallic material and then the coated material is passivated with oxygen-containing water. It is pointed out that the application of the conductive polymer alone does not guarantee adequate corrosion protection, and the metallic material is therefore preferably provided with a corrosion-protecting coating after the passivation. The conductive polymer can be removed again before the application of the corrosion-protecting coating.

SUMMARY OF THE INVENTION

The object of the invention is to make available coated articles which contain a layer of copper or a copper alloy, wherein on the one hand the copper or the copper alloy is effectively protected against oxidation and on the other hand a loss of the solderability of the copper or the copper alloy during storage is prevented.

This object is achieved through a coated article which has
(i) at least one electrically nonconductive base layer,
(ii) at least one layer of copper and/or a copper alloy, and
(iii) a layer which contains at least one electrically conductive polymer.

The article is characterized in that the copper or copper alloy layer (ii) is positioned between the base layer (i) and the layer (iii) containing the conductive polymer.

DETAILED DESCRIPTION OF THE PREFERRED EMBODIMENT

Figure 1:
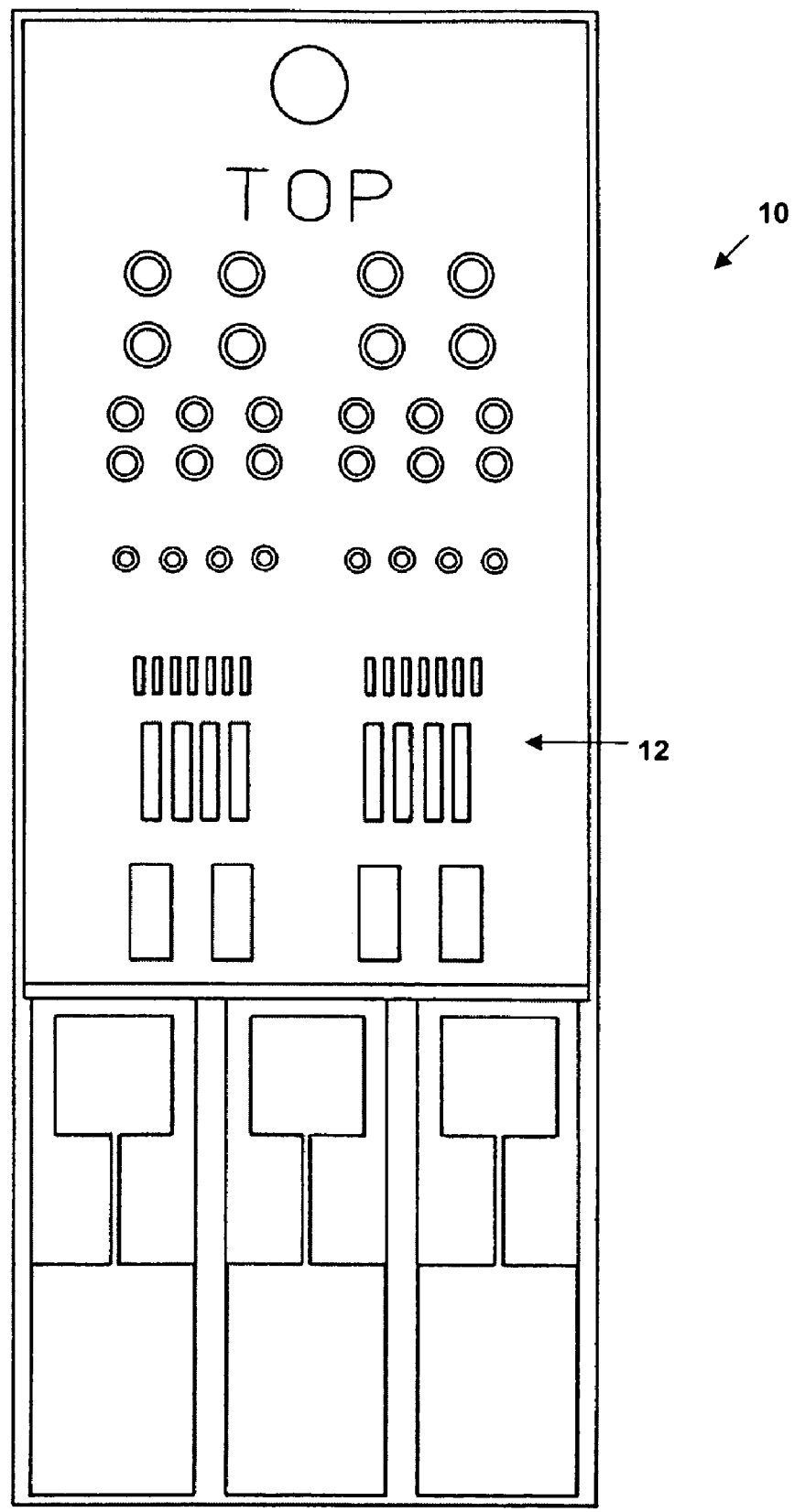
FIG. 1 is a simplified plan view of a printed circuit board featuring a test design.

The solution according to the invention is surprising in that, as was not to be expected with regard to the state of the art, the coating with an electrically conductive polymer alone would allow an effective protection of copper against oxidation and corrosion. Certainly no improvement as regards the preservation of the solderability of copper and copper alloys was to be expected. According to the state of the art, layers of conductive polymer cause the formation of thin metal oxide layers on the surface of metals which are less noble than silver. The formation of such oxide layers is however substantially held responsible for the loss of the solderability of copper.

The thickness of the layer (iii) is preferably less than 1 μm, which contradicts the general expectation, according to which a larger effect would be achieved with thicker layers. The thickness of the layer (iii) is preferably at least about 10 nm. Particularly preferred are layer thicknesses less than 500 nm, particularly preferably less than 200 nm.

The layer contains at least one electrically conductive polymer, which is preferably used in the form of an organic metal. Combinations of different substances from this substance class can be used. In the context of this invention, if not otherwise stated, polymers are understood to mean organic polymers.

Electrically conductive polymers or conductive polymers, which are also described as "intrinsically conductive polymers", are understood to mean substances which are built up of small molecule compounds (monomers), are at least oligomeric by polymerization, and thus contain at least 3 monomer units which are linked by chemical bonding, display a conjugated π-electron system in the neutral (nonconductive) state and can be converted by oxidation, reduction or protonation (which is often described as "doping") into an ionic form which is conductive. The conductivity is at least $10^{-7}$ S/cm and is normally less than $10^5$ S/cm.

As doping agents, for example iodine, peroxides, Lewis and protic acids are used in the case of doping by oxidation, or for example sodium, potassium, calcium in the case of doping by reduction.

Conductive polymers can be chemically exceptionally diverse in composition. As monomers, for example acetylene, benzene, naphthalene, pyrrole, aniline, thiophene, phenylene sulphide, peri-naphthalene and others, and derivatives thereof, such as sulpho-aniline, ethylenedioxythiophene, thieno-thiophene and others, and alkyl or alkoxy derivatives thereof or derivatives with other side-groups, such as sulphonate, phenyl and other side-groups, have proved useful. Combinations of the aforesaid monomers can also be used as monomers. For this, for example aniline and phenylene sulphide are linked, and these A-B dimers then used as monomers. Depending on the objective, for example pyrrole, thiophene or alkylthiophenes, ethylenedioxythiophene, thieno-thiophene, aniline, phenylene sulphide and others can be bound together into A-B structures and these then converted into oligomers or polymers.

Most conductive polymers display a more or less strong rise in conductivity with increasing temperature, which identifies them as non-metallic conductors. Other conductive polymers display a metallic behaviour at least in a temperature range close to room temperature in that their conductivity decreases with increasing temperature. A further method of recognizing metallic behaviour consists in the plotting of the so-called "reduced activation energy" of the conductivity against the temperature at low temperatures (down to near 0 K). Conductors with a metallic contribution to the conductivity display a positive gradient of the curve at low temperature. Such substances are described as "organic metals".

Organic metals are known per se. According to Weßling et al., Eur. Phys. J. E 2, 2000, 207-210, the transition from the state of a nonmetallic to an at least partially metallic conductor can be effected by a single-step frictional or dispersion procedure after completion of the synthesis of the intrinsically conductive polymer, the process technology basis whereof is described in EP 0 700 573 A. In this way, through the dispersion procedure the conductivity is also increased, without the chemical composition of the conductive polymer used being significantly altered.

Preferred intrinsically conductive polymers are those mentioned above. In particular, the following can be mentioned as examples: polyaniline (PAni), polythiophene (PTh), poly(3, 4-ethylenedioxy-thiophens) (PEDT), polydiacetylene, polyacetylene (PAc), poly-pyrrole (PPy), polyisothianaphthene (PITN), polyheteroarylene-vinylene (PArV), wherein the heteroarylene group can for example be thiophene, furan or pyrrole, poly-p-phenylene (PpP), polyphenylene sulphide (PPS), polyperinaphthalene (PPN), polyphthalocyanine (PPc) and others, and derivatives thereof (which are for example formed with monomers substituted with side-chains or -groups), copolymers thereof and physical mixtures thereof. Particularly preferred are polyaniline (PAni), polythiophene (PTh), polypyrrole (PPy), poly(3,4-ethylenedioxythiophenes) (PEDT), polythieno-thiophene (PTT) and derivatives thereof and mixtures thereof. Most preferred is polyaniline.

The layer (iii) can consist exclusively of one or several conductive polymers and/or organic metals or contain mixtures of one or more conductive polymers with other substances such as electrically non-conductive components. According to a preferred version, the layer (iii) contains polymer blends, that is mixtures of conductive polymer/organic metal (or a combination of several) with electrically non-conductive polymers. Particularly suitable as non-conductive polymers are water-soluble or water-dispersible polymers, in particular polystyrene-sulphonic acid, polyacrylates, polyvinyl butyrates, polyvinyl-pyrrolidones, polyvinyl alcohols and mixtures thereof. Conductive and non-conductive polymers are preferably used in the ratio of 1:1.5 to 1:20.

The layer (iii) can also contain further additives, in particular viscosity modifiers, flow aids, drying aids, gloss improvers, flatting agents and mixtures thereof, preferably in a concentration of 0.10 to 5 wt. % additive based on the mass of the layer (iii). The layer (iii) preferably contains 5 to 98 wt. %, in particular 15 to 40 wt. % of conductive polymer, based on the mass of the layer (iii).

It has been found that a combination of the conductive polymer(s)/organic metal(s) with complexing agents such as are capable of complexing copper can be advantageous. Preferred complexing agents are imidazoles, benzimidazoles or comparable complexing agents, such as benzotriazoles, thiourea, imidazole-2-thione and mixtures thereof, which are characterized by relatively good thermal stability.

As base layer (i), all materials used in printed circuit board technology are suitable, in particular epoxides and epoxide composites, Teflon, cyanate esters, ceramics, cellulose and cellulose composites, such as for example cardboard, materials based on these substances and flexible base layers, for example based on polyimide. The base layer preferably has a layer thickness of 0.1 to 3 mm.

The copper layer or copper alloy layer (ii) preferably has a thickness of 5 to 210 μm, in particular 15 to 35 μm.

Between the layer (ii) and the layer (iii), a further metal or alloy layer (iv) can be positioned. The layer (iv) preferably contains silver, tin, gold, palladium or platinum. According to a preferred version, the layer (iv) contains mainly, i.e. more than 50 wt. % based on the mass of the layer (iv), one or several of the said metals. The said metals can in particular be present as an alloy with copper. According to another preferred version, the layer (iv) consists exclusively of the said metals, either in pure form or in the form of an alloy. The layer (iv) preferably has a layer thickness of 10 to 800 nm. As well as the metal or the alloy, the layer (iv) can contain organic components, in a concentration of preferably 1 to 80 wt. % based on the total mass of the layer (iv) (metal content 20 to 99 wt. %). Preferred organic components are conductive polymers or organic metals, or organic copper complexing agents such as thiourea or benzotriazoles.

The articles according to the invention are particularly suitable for the production of printed circuit boards, and the articles are preferably printed circuit boards which are also described as boards. These are thin plates used for the assembly of electrical components, which can have holes. The holes serve for example for the connection of the upper and underside of the plates, for the supply of solder or for accommodating the leads of components for further soldering.

For the production of the coated articles according to the invention and in particular of printed circuit boards
(1) a layer of copper or a copper-containing alloy is applied onto the surface of a base layer;
(2) the layer produced in step (1) is structured; and
(3) a layer which contains at least one electrically conductive polymer is applied onto the structured copper or copper alloy layer.

According to a preferred version of the process, the copper or copper alloy layer (ii) is degreased and cleaned following step (1). For this the articles are preferably treated with normal commercial acidic or basic cleaners. Cleaners based on sulphuric acid and citric acid, such as for example the cleaner ACL 7001 from Ormecon GmbH, are preferred. The articles are preferably left in the cleaning bath for about 2 minutes at 45° C. and then washed with water.

In addition, it is preferable to pretreat the copper or copper alloy layer (ii) oxidatively following step (1) or after the cleaning, for example by etching the surface with $H_2O_2$ or inorganic peroxides. Suitable etching solutions are commercially available, for example the hydrogen peroxide-containing solution Etch 7000 from Ormecon GmbH. The articles are preferably left in the etching solution for about 2 minutes at 30° C.

The layer produced in step (1) is preferably structured by lithographic or etching processes, whereby the land pattern is created. The steps (1) and (2) can nowadays also be replaced by the direct application of a structured Cu conductor track or similar processes.

Following step (2), drill holes ("holes") are optionally created, which are then copper-plated.

The implementation of the individual steps of the above process is known per se to the skilled person. Preferably the layer (iii) is applied to the article by treating this, after rinsing with water, with a dispersion of the conductive polymer(s) or organic metal(s) in a dispersion agent which is liquid at room temperature, for example by immersion of the article in the dispersion or by application thereof onto the article. The electrically conductive polymer or polymers are preferably contained in the dispersion medium in colloidal form. Preferably the article is contacted with the dispersion for about 1 minute at room temperature. Additional components, such as electrically non-conductive polymers and additives can be dissolved in the dispersion medium or also be present therein in colloidal form. As dispersion media, organic solvents, preferably organic solvents miscible with water, water and mixtures thereof are suitable. Preferred solvents miscible with water are alcohols, in particular alcohols with a boiling point of more than 100° C. and preferably below 250° C. After the application of the dispersion onto the article, this is gently dried and if necessary further dispersion is applied, until the desired layer thickness is attained. The production and use of dispersions suitable for coating is known from the state of the art, see for example EP 0 407 492 B1.

Water and aqueous solvents are preferred as the dispersion medium. These are advantageous not only with regard to emissions and the non-wetting of the solder stop lacquer; it has also been found that water and aqueous solvents yield better results. This was surprising in that oxidation processes on copper proceed particularly rapidly in an aqueous environment. Solder stop lacquer is used to mask the areas of the printed circuit board which must not be wetted by the solder during the assembly process. The solder stop lacquer should not be wetted by the conductive polymer, since otherwise this would cause short circuits between the contact points.

Preferably dispersions which contain no formic acid are used, however, other acids and/or buffers can be contained in the dispersions.

Particularly suitable dispersions are commercially obtainable, for example dispersions based on polyaniline, such as dispersions of polyaniline-polystyrenesulphonic acid blends in water, e.g. the product D 1012 from Ormecon GmbH, and dispersions of polyaniline-polyvinylpyrrolidone in water, e.g. the product D 1021 from Ormecon GmbH.

It is also possible for polymer blends with a content of preferably 0.1 to 45 wt. % and particularly preferably 5 to 35 wt. % of intrinsically conductive polymer to be used instead of the pure intrinsically conductive polymer. As well as intrinsically conductive polymer, these polymer blends contain other polymers, copolymers or polymer mixtures, such as for example polyamides, polyesters, polyethers, such as polyethylene oxides, water-based copolymer latices, such as for example vinyl acetate butyl acrylate, or other copolymer latices and/or polyvinyl alcohols. Particularly preferred other polymers are polyamides.

The coated articles according to the invention are characterized in particular in that they not only can be soldered well after prolonged storage, but also are solderable several times, i.e. can be used in multistage soldering processes, so-called reflow processes. In this respect, by means of the coated articles according to the invention a significant approximation of the soldering and ageing properties to printed circuit boards with metallic final surfaces could be achieved, which can be stored for up to 12 months, without impairing their solderability, and which can be soldered several times after storage. In contrast to this, conventional printed circuit boards, which are treated with copper-complexing agents alone, so-called "OSP" (Organic Solderability Preservative), to maintain their solderability are as a rule already no longer solderable after storage for only 3 to 6 months, let alone suitable for multiple reflow processes. The printed circuit boards are regarded as particularly suitable for reflow processes if the soldering angle is less than 90°, preferably 60° or less. As OSP's, acidic, aqueous formulations based for example on benzotriazoles, which contain formic acid and/or acetic acid, are mostly used.

Below, the invention is further explained by means of a diagram and by non-limiting embodiments, wherein FIG. 1 shows a printed circuit board 10 with a test design 12.

Embodiments

EXAMPLES 1 TO 2

Production of Coated Printed Circuit Boards

Epoxy resin composite printed circuit boards 10 were cleaned and degreased using a normal commercial cleaner based on sulphuric acid and citric acid (ACL 7001, Ormecon GmbH) in a cleaning bath for 2 minutes at 45° C. The printed circuit boards had a test design 12 (see FIG. 1), which has been agreed with test institutes and printed circuit board manufacturers and is modelled on real printed circuit board structures. These boards enable the solderability to be measured and assessed. Next, the printed circuit boards 10 were rinsed with tap-water at room temperature and then treated with an H2O2-containing etching solution (Etch 7000, Ormecon GmbH) for 2 minutes at 30° C. After etching, the boards were again rinsed with tap-water at room temperature and then coated with the conductive organic polymers listed in Table 1. For this, the boards were immersed in an aqueous dispersion of the polymer in question at room temperature for 1 minute. After this, the printed circuit boards were dried at 45 to 75° C.

process, in that some boards were stored for 1 hour at 100° C. and others for 4 hours at 144° C. The soldering angle (wetting angle: according to the Standard NF A 89 400 P or ANSI-J-STD 003 I.E.C. 68-2-69) of the freshly prepared boards and those aged at 100° C. or 144° C. were determined with a normal commercial meniscograph (Type ST 60, Metronelec Co.). The device measures the wetting force against time and converts this to soldering angles by normal procedures (see manual). In each case, the soldering angle was measured with no reflow cycle, and after 2 and after 3 reflow cycles. The reflow cycles serve for the simulation of repeated soldering operations and were effected in an HA 06 Hot-Air/Quartz Reflow Oven (C.I.F./Athelec Co., France), which by means of temperature profiles simulates multiple soldering.

The results of the soldering angle measurements are shown in Table 2.

TABLE 2

Results of Soldering Angle Measurement[1]

| | Freshly Produced Boards | | | 1 Hr Aging at 100° C. | | | 4 Hrs Aging at 155° C. | | |
|---|---|---|---|---|---|---|---|---|---|
| Ex. | 1st SO | 2nd SO | 3rd SO | 1st SO | 2nd SO | 3rd SO | 1st SO | 2nd SO | 3rd SO |
| 1 | 10 | 61 | 61 | 22 | 68 | 76 | 49 | 74 | 77 |
| 2 | 20 | 65 | 82 | 24 | 50 | 73 | 33 | 70 | 76 |
| 3* | 29 | 68 | 99 | 30 | 39 | 91 | 70 | 102 | 93 |
| 4* | 21 | 51 | 84 | 21 | 50 | 75 | 52 | 83 | 96 |

[1] Soldering angle in ° after 2 seconds, measured with lead-containing solder (Sn/Pb = 60/40)
SO Soldering operation
*Comparison Experiment

TABLE 1

Polymers Used for Coating the Boards

| Example | Conductive Polymer |
|---|---|
| 1 | polyaniline-polypyrrolidone blend[1] |
| 2 | polyaniline-polypyrrolidone blend[1] with addition of a copper complexing agent[2] |

[1] D 1021, Ormecon GmbH
[2] Benzotriazole (2 MZA, Shikoku Co.)

Dispersion 1 contained 1.25 wt. % of solids and dispersion 2 1.25 wt. %, and in dispersion 2 the solids fraction contained 6 wt. % of the copper complexing agent, based on the mass of the solids fraction.

EXAMPLES 3 AND 4

Production of Coated Printed Circuit Boards (Comparison)

Analogously to Examples 1 to 2, printed circuit boards were coated with normal commercial agents based on benzotriazole in accordance with the respective use instructions (Glicoat Tough Ace F2 (LX); Shikoku Co., Japan, Example 3 and Entek Plus Cu 106 A, Enthone OMI Co., Netherlands, Example 4).

EXAMPLE 5

Soldering Angle Measurement

Some of the printed circuit boards 10 produced in Examples 1 to 4 were subjected to an accelerated ageing The results in Table 2 show that the soldering angles increase with increasing ageing and in particular with repeated soldering. While the soldering angles in the first soldering operation for the printed circuit boards 10 according to the invention and the printed circuit boards according to the state of the art still lie at a comparable order of magnitude even after the second ageing step, a marked increase in the soldering angle, which sometimes already lies above the critical value of 90° (Example 3), is already observed with the comparison boards in the second soldering operation. In the third soldering operation, the soldering angles of both comparison boards are over 90°, at 93° and 96°, which indicates poor wetting of the surfaces and inadequate solderability. In contrast to this, with the boards according to the invention, after four hours' storage at 155° C. no increase in the soldering angle is detectable on transition from the second to the third soldering operation, so that even in the aged state these boards are without reservation suitable for repeated soldering operations.

EXAMPLE 6

Production of Coated Printed Circuit Boards

Epoxy resin composite Cu printed circuit boards with a test design 12 (see FIG. 1) were cleaned and degreased in accordance with Example 1 in a cleaning bath for 2 minutes at 45° C. using a normal commercial cleaner based on sulphuric acid and citric acid (ACL 7001, Ormecon GmbH). Next, the printed circuit boards 10 were rinsed three times (<1 min) at room temperature with tap-water and then treated with an H2O2-containing etching solution (Micro Etch MET 7000, concentration: 2 vol. %, Ormecon GmbH) for 2 minutes at 35° C. After etching, the boards 10 were again rinsed 3 times (<1 min) at room temperature with tap-water and then coated with an aqueous dispersion of electrically conductive polyaniline (PA, concentration: 0.5% organic metal). For this, the boards 10 were immersed in the dispersion for about 3 minutes at 35° C. After this, the printed circuit boards were rinsed three times (<0.5 min) with deionized water (50° C.) and then thoroughly dried. After the treatment, the printed circuit boards 10 had a thin, uniform and planar, transparent coating with a thickness of 100 to 200 nm. Next the soldering angle was determined in the manner described in Example 5. The results are shown in Table 3. Printed circuit boards which had been coated with tin (Sn) in the conventional way served as a comparison.

The results show that the solderability of the coated boards according to the invention is comparable with that of tin-coated boards.

TABLE 3

| Results of Soldering Angle Measurement[1] | | | | |
|---|---|---|---|---|
| Coating | 2× Reflow | 3× Reflow | 1 Hr Aging at 100° C. | 4 Hrs Aging at 155° C. |
| PA[2] | 35° | 45° | 30° | 40° |
| Sn[3] | 29° | 42° | — | 18° |

[1] Soldering angle measured with lead-containing solder (Sn/Pb 60/40)
[2] Electrically conductive polyaniline
[3] Tin coating
*Comparison Experiment While the invention has been particularly shown and described with reference to a number of embodiments, it would be understood by those skilled in the art that changes in the form and details may be made to the various embodiments disclosed herein without departing from the spirit and scope of the invention and that the various embodiments disclosed herein are not intended to act as limitations on the scope of the claims.

What is claimed is:

1. A coated article comprising:
 (i) at least one electrically non-conductive base layer,
 (ii) at least one layer of at least one of copper and a copper alloy applied on a surface of the base layer (i), and
 (iii) a layer which contains at least one intrinsically conductive polymer,
 characterized in that the copper or copper alloy layer (ii) is positioned between the base layer (i) and the layer (iii) containing the conductive polymer, wherein the layer (iii) further comprises at least one electrically non-conductive polymer in addition to the at least one intrinsically conductive polymer, wherein the layer (iii) contains at least one complexing agent capable of complexing copper in addition to the at least one electrically non-conductive polymer, wherein the complexing agent is selected from the group consisting of benzimidazoles, imidazoles, benzotriazoles, thiourea, imidazole-2-thiones and mixtures thereof.

2. The coated article according to claim 1, wherein the layer (iii) has a layer thickness of 10 nm to 1 μm.

3. The coated article according to claim 2, wherein the layer (iii) has a layer thickness of less than 500 nm.

4. The coated article according to claim 3, wherein the layer (iii) has a layer thickness of less than 200 nm.

5. The coated article according to claim 1, wherein the layer (iii) contains 5 wt. % to 98 wt. % of intrinsically conductive polymer, based on the mass of the layer (iii).

6. The coated article according to claim 1, wherein the intrinsically conductive polymer is selected from the group consisting of polyaniline (PAni), polythiophene (PTh), polypyrrole (PPy), poly(3,4-ethylenedioxythiophenes) (PEDT), polythieno-thiophene (PTT), derivatives thereof and mixtures thereof.

7. The coated article according to claim 1, wherein a polymer blend with a content of at least one intrinsically conductive polymer is used as the intrinsically conductive polymer.

8. The coated article according to claim 1, wherein the base layer (i) contains a material selected from the group consisting of epoxide, epoxide composite, Teflon, cyanate ester, ceramic, cellulose, cellulose composite, cardboard and polyimide.

9. The coated article according to claim 1, wherein the base layer (i) has a layer thickness of 0.1 to 3 mm.

10. The coated article according to claim 1, wherein the layer (ii) has a layer thickness of 5 to 210 μm.

11. The coated article according to claim 1, further comprising a metal or alloy layer (iv), which is positioned between the layer (ii) and the layer (iii).

12. The coated article according to claim 11, wherein the layer (iv) contains a material selected from the group consisting of silver, tin, gold, palladium and platinum.

13. The coated article according to claim 11, wherein the layer (iv) has a layer thickness of 10 to 800 nm.

14. The coated article according to claim 1 in the form of a printed circuit board.

* * * * *